United States Patent
Nobunaga (10) Patent No.: US 9,921,782 B2
(45) Date of Patent: Mar. 20, 2018

(54) MEMORY DEVICE FOR EMULATING DYNAMIC RANDOM ACCESS MEMORY (DRAM)

(71) Applicant: Avalanche Technology, Inc., Fremont, CA (US)

(72) Inventor: Dean K. Nobunaga, Cupertino, CA (US)

(73) Assignee: Avalanche Technology, Inc., Fremont, CA (US)

(*) Notice: Subject to any disclaimer, the term of this patent is extended or adjusted under 35 U.S.C. 154(b) by 110 days.

(21) Appl. No.: 15/011,344

(22) Filed: Jan. 29, 2016

(65) Prior Publication Data

US 2017/0220301 A1    Aug. 3, 2017

(51) Int. Cl.
   *G11C 7/00* (2006.01)
   *G06F 3/06* (2006.01)
   *G06F 12/0802* (2016.01)
   *G11C 11/16* (2006.01)

(52) U.S. Cl.
   CPC ............ *G06F 3/0679* (2013.01); *G06F 3/061* (2013.01); *G06F 3/0656* (2013.01); *G06F 12/0802* (2013.01); *G11C 11/1675* (2013.01); *G06F 2212/2024* (2013.01); *G06F 2212/60* (2013.01)

(58) Field of Classification Search
   CPC .... G06F 3/0679; G06F 12/0802; G06F 3/061; G06F 3/0656; G06F 2212/60; G06F 2212/2024; G11C 11/1675; G11C 11/161
   See application file for complete search history.

(56) References Cited

U.S. PATENT DOCUMENTS

| | | | |
|---|---|---|---|
| 8,687,403 B1* | 4/2014 | Derhacobian ...... | G11C 13/0007 365/100 |
| 2002/0131296 A1 | 9/2002 | Hirai | |
| 2004/0042328 A1 | 3/2004 | Hirai | |
| 2014/0016404 A1* | 1/2014 | Kim ..................... | G11C 11/165 365/158 |

* cited by examiner

*Primary Examiner* — Mohammed A Bashar
(74) *Attorney, Agent, or Firm* — Bling K. Yen (57) ABSTRACT

The present invention is directed to a magnetic memory device that emulates DRAM and provides a plug-in or drop-in replacement for DRAM. The memory device includes one or more magnetic memory banks for storing data; a controller configured to issue a dormant write command upon receiving a refresh command for recharging DRAM capacitors; and a memory cache for storing temporary data and configured to save the temporary data to the one or more magnetic memory banks upon receiving the dormant write command from the controller. The memory device may be compliant with at least one version of low power DDR (LPDDR) Specification or at least one version of DDR SDRAM Specification.

14 Claims, 4 Drawing Sheets

MEMORY DEVICE FOR EMULATING DYNAMIC RANDOM ACCESS MEMORY (DRAM)

BACKGROUND

The invention relates generally to a memory device, and more particularly, to a memory device that emulates dynamic random access memory (DRAM).

Magnetic random access memory (MRAM) is a new class of non-volatile memory. Unlike volatile memory, such as dynamic random access memory (DRAM) that loses the stored information when power is interrupted, non-volatile memory can retain the stored information even when powered off.

An MRAM device normally comprises an array of memory cells, each of which includes at least a magnetic memory element and a selection element or transistor coupled in series between appropriate electrodes. Upon application of an appropriate current or voltage to the magnetic memory element in the programming step, the electrical resistance of the magnetic memory element would change accordingly, thereby switching the stored logic in the respective memory cell.

The magnetic memory element typically includes at least a magnetic reference layer and a magnetic free layer with a non-magnetic tunnel junction layer interposed therebetween, thereby forming a magnetic tunneling junction (MTJ). The magnetic reference layer has a fixed magnetization direction and may be anti-ferromagnetically exchange coupled to a magnetic pinned layer, which has a fixed but opposite or anti-parallel magnetization direction. Upon the application of an appropriate current through the MTJ, the magnetization direction of the magnetic free layer can be switched between two directions: parallel and anti-parallel with respect to the magnetization direction of the magnetic reference layer. The non-magnetic tunnel junction layer is normally made of an insulating material with a thickness ranging from a few to a few tens of angstroms. When the magnetization directions of the magnetic free and reference layers are substantially parallel, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel. Accordingly, the stored logic in the magnetic memory element can be switched by changing the magnetization direction of the magnetic free layer.

Based on the relative orientation between the magnetic reference and free layers and the magnetization directions thereof, an MTJ can be classified as in-plane MTJ or perpendicular MTJ. The magnetic reference and free layers of an in-plane MTJ have magnetization directions that lie in planes substantially parallel to layer planes thereof, whereas the magnetic reference and free layers of a perpendicular MTJ have magnetization directions that are substantially perpendicular to layer planes thereof.

The stability of the magnetic free layer in the MTJ enables an MRAM device to have years of data retention but may prevent the same device to program at a high speed comparable to that of DRAM, thereby limiting MRAM's usage in memory applications.

For the foregoing reasons, there is a need for a memory device that includes MRAM and emulates DRAM by operating at a high input/output (I/O) speed while retaining the non-volatility characteristic of the MRAM.

SUMMARY

The present invention is directed to a memory device that satisfies this need. An memory device having features of the present invention comprises one or more magnetic memory banks for storing data; a controller configured to issue a dormant write command upon receiving a refresh command for recharging DRAM capacitors; and a memory cache for storing temporary data and configured to save the temporary data to the one or more magnetic memory banks upon receiving the dormant write command from the controller. The memory device may be compliant with at least one version of low power DDR (LPDDR) Specification or at least one version of DDR SDRAM Specification.

According to another aspect of the present invention, a dual in-line memory module (DIMM) comprises a module controller including a double data rate (DDR) interface and a plurality of memory devices connected to the module controller. Each of the memory devices includes one or more magnetic memory banks for storing data; a controller configured to issue a dormant write command upon receiving a refresh command for recharging DRAM capacitors; and a memory cache for storing temporary data and configured to save the temporary data to the one or more magnetic memory banks upon receiving the dormant write command from the controller.

According to still another aspect of the present invention, a method for operating a memory device that includes a data buffer, one or more magnetic memory banks connected to the data buffer, a memory buffer, a memory cache connected to the memory buffer, the method comprises the steps of loading a data associated with a write command into the data buffer and the memory buffer; determining whether an incoming command immediately following the write command is another write command; if the incoming command is another write command, saving the data to the one or more magnetic memory banks from the data buffer; and if the incoming command is not another write command, loading the data to the memory cache from the memory buffer and then saving the data to the one or more magnetic memory banks from the memory buffer when the memory device receives a refresh command for recharging DRAM capacitors.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "(a first number) to (a second number)" or "(a first number)-(a second number)," this means a range whose lower limit is the first number and whose upper limit is the second number. For example, "25 to 100 nm" means a range whose lower limit is 25 nm and whose upper limit is 100 nm.

Figure 1:
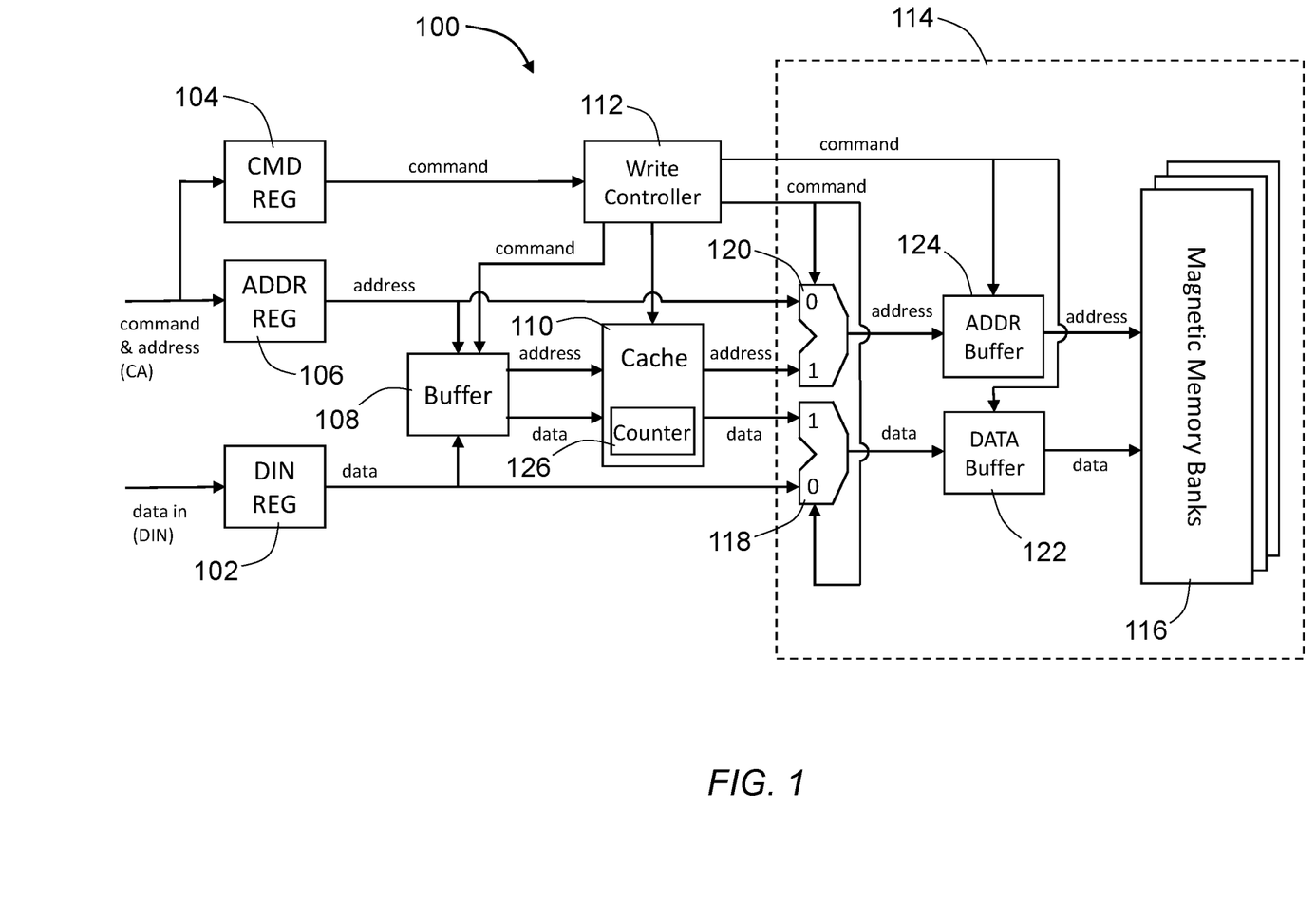
FIG. 1 is a diagram illustrating a memory device for emulating DRAM in accordance with an embodiment of the present invention.

An embodiment of the present invention as applied to a memory device including MRAM will now be described with reference to FIG. 1. Referring now to FIG. 1, the illustrated memory device 100 comprises a data-in (DIN) register 102, a command (CMD) register 104, an address (ADDR) register 106, a memory buffer 108, a memory cache 110, a write controller 112, and a magnetic memory system 114, which includes one or more magnetic memory banks 116 for storing data.

Figure 2:
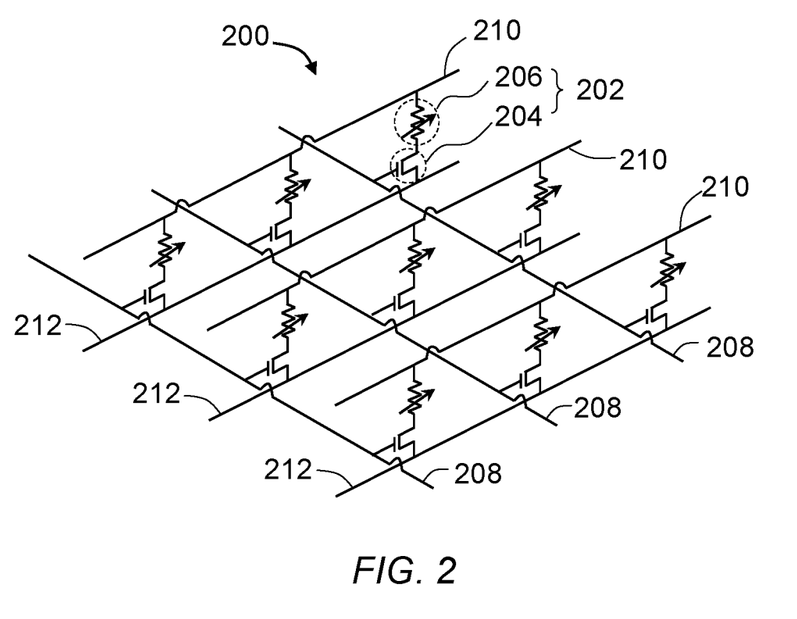
FIG. 2 is a circuit diagram illustrating an array of memory cells in accordance with an embodiment of the present invention.

Each of the magnetic memory banks 116 has one or more arrays of magnetic memory cells with each array of memory cells organized into a row-column array configuration. FIG. 2 illustrates a schematic circuit diagram for an exemplary array of magnetic memory cells in accordance with an embodiment of the present invention. The memory array 200 comprises a plurality of magnetic memory cells 202 with each of the magnetic memory cells 202 including a selection transistor 204 coupled to an MTJ memory element 206; a plurality of parallel word lines 208 with each coupled to gates of a respective row of the selection transistors 204 in a first direction; and a plurality of parallel bit lines 210 with each coupled to a respective row of the magnetic memory elements 206 in a second direction perpendicular to the first direction; and optionally a plurality of parallel source lines 212 with each coupled to a respective row of the selection transistors 204 in the first or second direction. The selection transistor 204 may be replaced by other suitable selector elements, such as but not limited to diode, Schottky diode, and ovonic threshold switch. The magnetization of the MTJ memory element 206 may be switched by applying a switching current directly through the MTJ memory element 206. In an embodiment, at least a magnetic free layer and a magnetic reference layer in the MTJ memory element 206 have magnetization directions that are substantially perpendicular to layer planes thereof.

Referring back to FIG. 1, the magnetic memory system 114 further includes a data selector 118 and an address selector 120 for selecting the input source of the data and corresponding address. The data selector 118 is connected to the DIN register 102, the memory cache 110, and the write controller 112. The address selector 120 is connected to the address register 106, the memory cache 110, and the write controller 112. The data selector 118, in response to a command from the write controller 112, selects either the DIN register 102 or the memory cache 110 as the source of data input that will be saved to the magnetic memory banks 116. Similarly, the address selector 120, in response to the command from the write controller 112, selects either the address register 106 or the memory cache 110 as the source of data address input that will identify the location of the data saved to the magnetic memory banks 116.

The magnetic memory system 114 may also include an optional data buffer 122 and an optional address buffer 124 connected to the magnetic memory banks 116 and to the data selector 118 and the address selector 120, respectively. The data buffer 122 and the address buffer 124 temporarily store the output data of the data selector 118 and the output data address of the address selector 120, respectively. Accordingly, the output of the data buffer 122 is data that is to be saved in the magnetic memory banks 116 at a location identified by the output address of the address buffer 124. In embodiments where the optional data buffer 122 and the address buffer 124 are absent, the selectors 118 and 120 may be directly connected to the magnetic memory banks 116, and the output data of the data selector 118 may be directly saved to the magnetic memory banks 116 at a location identified by the output address of the address selector 120. The exemplary memory device 100 in FIG. 1 is shown to have one set of data/address selectors and buffers 118-124 for the magnetic memory banks 116. However, in alternative embodiments, each of the magnetic memory banks 116 may be controlled by a different one of multiple sets of data/address selectors and buffers.

When the process of saving data to the magnetic memory banks 116 is interrupted or cannot keep pace with subsequent incoming commands, the memory buffer 108, which is connected to the DIN register 102, the address register 106, the memory cache 110, and the write controller 112, outputs to the memory cache 110 with left-over or residual data that still has yet to be written to the magnetic memory banks 116 despite the apparent consummation of the write operation. The content of the memory cache 110 is then flushed to the magnetic memory system 114 at an opportunistic time later. The memory cache 110 may operate in the first-in, first-out (FIFO) queuing mode but is not limited thereto. The memory cache 110 may operate in other queuing modes as desired by designers. The memory cache 110 and the memory buffer 108 each may be made of any suitable memory with sufficient write speed, such as but not limited to static random access memory (SRAM), DRAM, or MRAM. The memory cache 110 may further include therein a residual data counter 126. In alternative embodiments, the residual data counter 126 is disposed outside of the memory cache 110. The residual data counter 126 tracks the number of a unit of left-over or residual data in the memory cache 110. A unit of data may be, without limitation, bit, byte, prefetch buffer packet, segment, block, or sector.

The DIN register 102 receives input data, which may be 16 bits or other suitable lengths. The command register 104 and the address register 106 receive command and address (CA), which may be 6 bits or other suitable lengths. In embodiments where CA is 6 bits, one bit may be allocated for "chip select" while the remaining bits may be used for command and address corresponding to the input data.

The output of the DIN register 102 is connected to both the input of the data selector 118 of the magnetic memory system 114 and the input of the memory buffer 108. The output of the command register 104 is connected to the write controller 112. The output of the address register 106 is connected to both the input of the address selector 120 of the magnetic memory system 114 and the input of the memory buffer 108. The memory buffer 108 outputs data and address to the memory cache 110, which then outputs data and address to the magnetic memory system 114. Accordingly, the DIN register 102 and the address register 106 may output data and address directly or via the memory buffer 108 and the memory cache 110 to the magnetic memory system 114.

The write controller 112 receives signals from the command register 104 and outputs command signals to the memory buffer 108, the memory cache 110, the data and address selectors 118 and 120, and the optional data and address buffers 122 and 124. The write controller 112 may be a dedicated device or a part of an integral controller that also manages read and other functions. The data and address selectors 118 and 120 may select the memory cache 110 as the input source after receiving a command (e.g., FIFO_SEL) from the write controller 112. The write controller 112 may load the residual data in the memory buffer 108 into the memory cache 110 by issuing another command (e.g., FIFO_BUFFER_LOAD) to the memory buffer 108. The write controller 112 may flush the residual data in the memory cache 110 into the data and address buffers 122 and 124 of the magnetic memory system 114 by issuing still another command (e.g. FIFO_LOAD) to the memory cache 110 in conjunction with the FIFO_SEL command to the selectors 118 and 120 for selecting the memory cache 110 as the input source. The content of the data buffer 122 may be written to the magnetic memory banks 116 at location(s) specified by the output addresses of the address buffer 124 upon yet another command (e.g., ARRAY_WRITE) from the write controller 112 to the data and address buffers 122 and 124 if present.

During normal write operations, the write controller 112 commands the data and address selectors 118 and 120 of the magnetic memory system 114 to accept input data and address from the DIN register 102 and the address register 106, respectively. The input data and the corresponding address are loaded into the data and address buffers 122 and 124, respectively. The output data of the data buffer 122 is then saved in the magnetic memory banks 116 at location(s) specified by the output address of the address buffer 124. In embodiments where the data and address buffers 122 and 124 are absent, the output data from the DIN register 102 is directly saved to the magnetic memory banks 116 at location(s) specified by the output address of the address register 106 during normal write operations.

When the process of saving data to the magnetic memory banks 116 is interrupted or cannot keep pace with subsequent incoming commands, the memory buffer 108, which receives all incoming data and corresponding address from the DIN register 102 and the address register 106, respectively, outputs to the memory cache 110 with residual data that still has not been written to the magnetic memory banks 116 despite the apparent consummation of the write operation. The residual data counter 126 is incremented as the residual data is loaded into the memory cache 110. The content of the memory cache 110 is then flushed to the magnetic memory system 114 at an opportunistic time later, such as during idling or other operations. The process of saving the cached data to the magnetic memory banks 116 is referred to herein as dormant write process.

During dormant write operations, the write controller 112 issues a command to the data selector 118 and the address selector 120 of the magnetic memory system 114 to select the memory cache 110 as the source of the data and address input. The residual data in the memory cache 110 is then saved to the magnetic memory banks 116 directly or via the data and address buffers 122 and 124 if present. As the content of the memory cache 110 is flushed to the magnetic memory system 114, the residual data counter 126 is decremented accordingly.

The memory device 100 may function as a direct replacement for DRAM, which stores information in memory elements made of capacitors. The stored information in the memory elements of DRAM will fade as the capacitors discharge unless the capacitor charge is refreshed periodically. By contrast, the memory device 100 utilizes the magnetic memory banks 116, which are non-volatile and thus do not require periodic recharging of the magnetic memory elements thereof. Consequently, a dormant write operation may be opportunistically activated by the write controller 112 upon receiving a REFRESH command from the command register 104 to charge the capacitors.

The memory device 100 may provide a drop-in replacement for DRAM and may be compliant with at least one version of low power DDR (LPDDR) Specification or at least one version of DDR SDRAM Specification known in the art or to be developed in the future, such as but not limited to LPDDR2, LPDDR3, LPDDR4, DDR SDRAM, DDR2 SDRAM, DDR3 SDRAM, or DDR4 SDRAM. The memory device 100 may also replace DRAM chips on a dual in-line memory module (DIMM).

Figure 3:
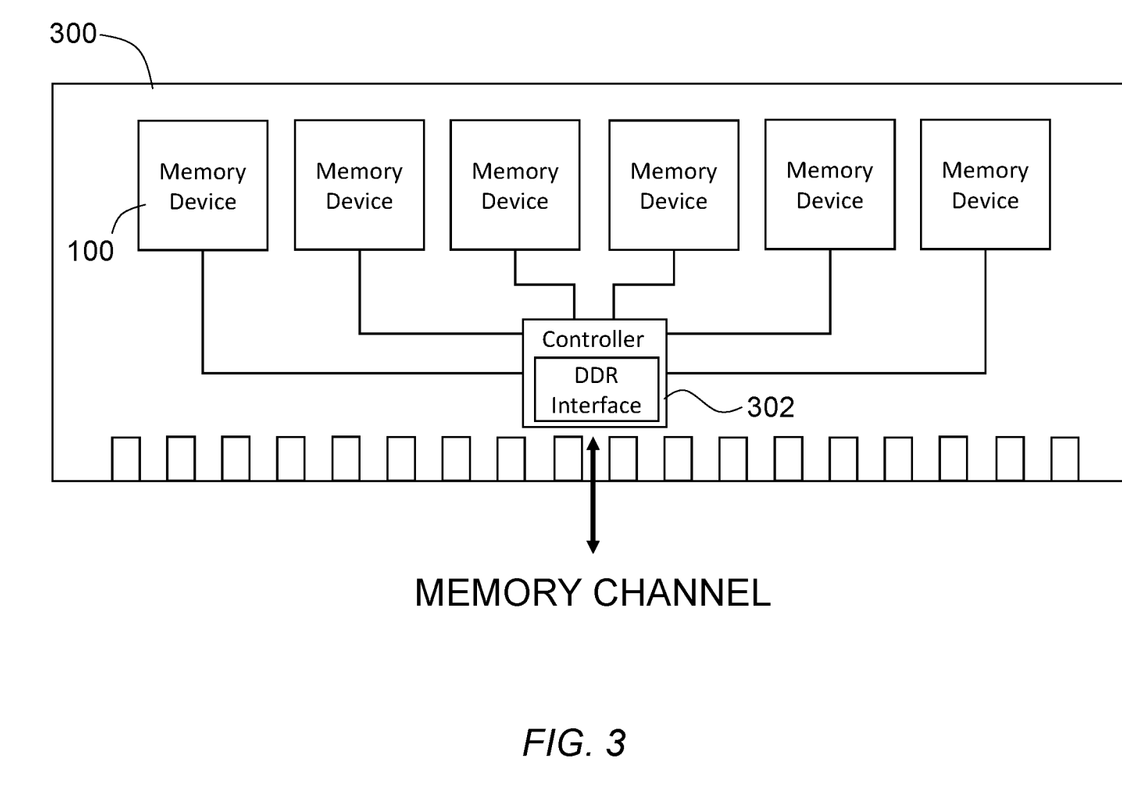
FIG. 3 is a diagram illustrating a dual in-line memory module (DIMM) in accordance with an embodiment of the present invention.

FIG. 3 shows an embodiment of the present invention as applied to a memory module 300 that incorporates therein a plurality of memory devices 100 of FIG. 1 and a controller 302 connected thereto. The controller 302 includes a double data rate (DDR) interface, which allows the memory module 300 to communicate with one or more central processing units (not shown) via a memory channel. The memory module 300 may have a dual in-line memory module (DIMM) form factor, such as but not limited to Dual In-line Memory Module (DIMM), Mini-DIMM, Register Dual In-Line Memory Module (RDIMM), Small Outline DIMM (SODIMM), or any other variant of DIMM known in the art or to be developed in the future. In an embodiment, the memory module 300 and the memory device 100 are compliant with at least one version of low power DDR (LPDDR) Specification or at least one version of DDR SDRAM Specification known in the art or to be developed in the future, such as but not limited to LPDDR2, LPDDR3, LPDDR4, DDR SDRAM, DDR2 SDRAM, DDR3 SDRAM, or DDR4 SDRAM.

Figure 4:
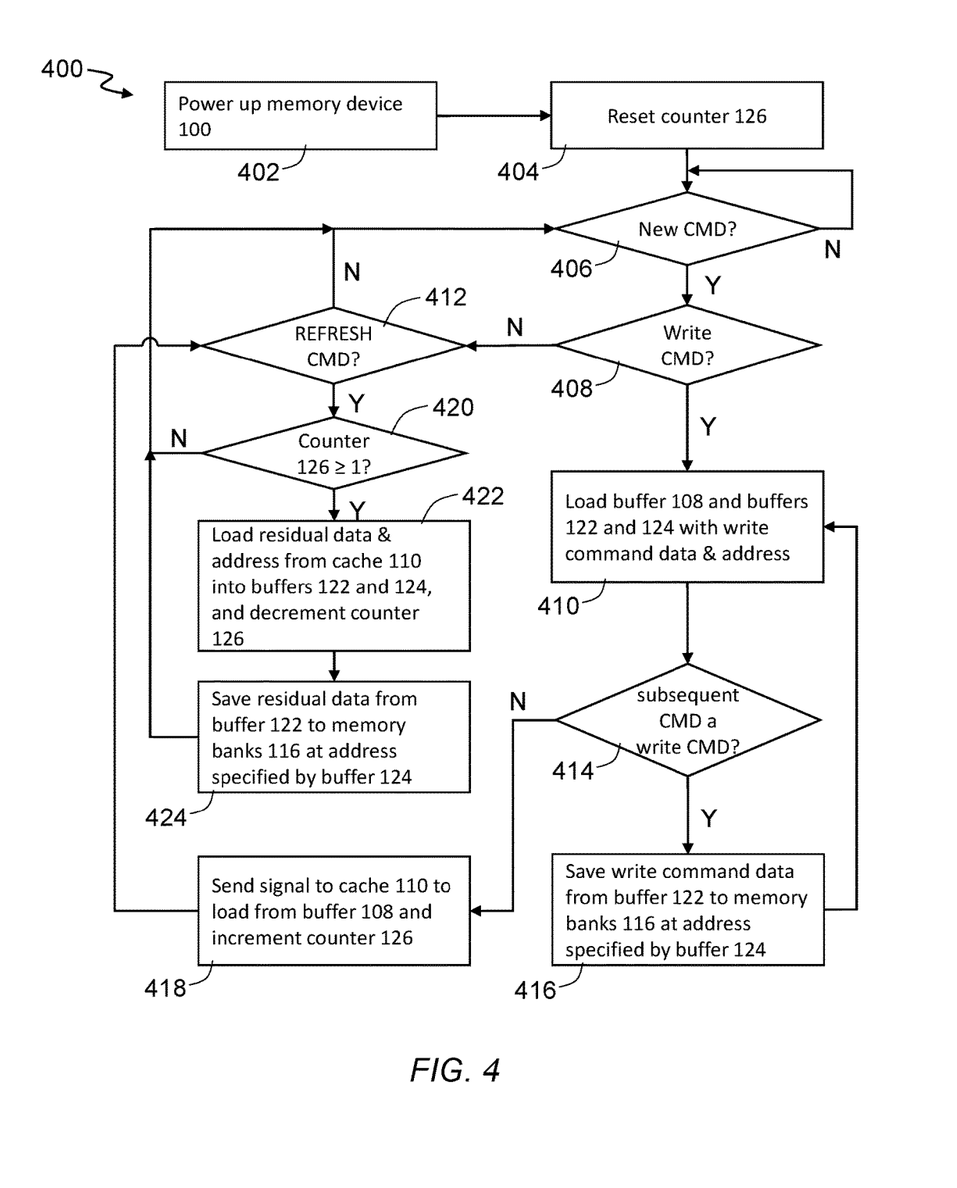
FIG. 4 is a flow chart showing selected steps performed by the memory device of FIG. 1 in accordance with a method embodiment of the present invention.

FIG. 4 illustrates a flow chart of selected steps 400 performed by the memory device 100 of FIG. 1 in accordance with a method embodiment of the present invention. The operating steps 400 begin by powering up the memory device 100 at step 402, after which the residual data counter 126 is reset by the write controller 112, the memory cache 110, or the counter 126 itself at step 404. If any of the buffers 108, 122, 124 and the memory cache 110 use non-volatile memory, the content thereof may be erased at the same step. Next, at step 406, the write controller 112 decides whether the command (CMD) in the command register 104 is a new command and if so, the process continues to step 408. Otherwise, the write controller 112 waits for a new command at step 406.

At step 408, the write controller 112 determines whether the new command from the command register 104 is a write command and if so, the process proceeds to step 410. Otherwise, the process continues to step 412, where the write controller 112 determines whether the command is a REFRESH command for charging DRAM capacitors.

At step 410, the memory buffer 108 is loaded with the output of the DIN register 102, which references to the write command and is referred to herein as write command data. The write command data from the output of the DIN register 102 also moves to the data buffer 122 of the magnetic memory system 114 with the data selector 118 set to select the DIN register 102 as the input source. Similarly, the address from the output of the address register 106 is loaded into the memory buffer 108 and the address buffer 124 in a manner analogous to that described above for the write command data. A write operation to the magnetic memory system 114 may be considered to be consummated after step 410 even though the write command data still has not been saved to the magnetic memory banks 116.

After step 410, the process continues to step 414, where a decision is made as to whether the next incoming command from the command register 104 is a write command. If not, the process advances to step 418. If the next incoming command is a write command, the process continues to step 416, at which the write command data stored in the data buffer 122 is saved to the magnetic memory banks 116 at location(s) specified by the output address of the address buffer 124. After step 416, the process loops back to step 410, at which the next incoming write command data and address from the DIN register 102 and the address register 106, respectively, are loaded into the memory buffer 108 and the data/address buffers 122 and 124 of the magnetic memory system 114. The process repeats the loop of steps 410, 414, and 416 for as long as incoming write commands are not interrupted by other commands.

If the next incoming command is not a write command as determined at step 414, then the process continues to step 418, at which the write controller 112 issues a command to load the write command data and address stored in the memory buffer 108 into the memory cache 110. Hence, the write command data in the memory cache 110 becomes residual data and the residual data counter 126 is incremented accordingly. Each time a unit of write command data is saved to the memory cache 110, the residual data counter 126 may be incremented by 1. The process advances to step 412 after step 418.

At step 412, where a decision is made as to whether the incoming non-write command is a refresh command for charging DRAM capacitors and if so, then the process advances to step 420. Otherwise, the process continues back to step 406 to wait for a new command. At step 420, another decision is made as to whether the memory cache 110 is empty. If the memory cache 110 contains residual data from previous write operations (i.e. the residual data counter 126 is greater or equal to 1, indicating presence of residual data), then the process continues to step 422. Otherwise, the process continues back to step 406 to wait for a new command.

At step 422, the residual data and corresponding address stored in the memory cache 110 is flushed into the data buffer 122 and the address buffer 124, respectively, with the data/address selectors 118 and 120 set to select the memory cache 110 as the input source. Each time a unit of residual data moves from the memory cache 110 to the magnetic memory system 114, the residual data counter 126 may be decremented by 1. After step 422, the residual data in the data buffer 122 is saved to the magnetic memory banks 116 at location(s) specified by the output address of the address buffer 124 at step 424, after which the process goes back to step 406 to wait for a new command.

Operation of the memory device 100 in accordance with the method embodiment shown in FIG. 4 may be further demonstrated by an example without limiting the invention thereto. The memory device 100, for example, may receive a series of commands that include at least the following commands in sequence: first write, second write, read, third write, fourth write, and refresh. Referencing to the flow chart of FIG. 4, the first write command data associated with the first write command would be saved to the magnetic memory banks 116 at step 416 by following steps 406, 408, 410, 414, and 416 in sequence because the subsequent command (second write) is another write command as determined at step 414.

The second write command data associated with the second write command would be saved to the memory cache 110 at step 418, thereby becoming residual data, by following steps 410, 414, 418, 412, and 406 because the subsequent command (read) is neither a write command as determined at step 414 nor a refresh command as determined at step 412.

Following the second write command, the read command simply prompts the memory device 100 to execute a loop of steps 406, 408, 412, and back to 406 because the read command is neither a write command as determined at step 408 nor a refresh command as determined at step 412.

The third write command follows the read command. Like the first write command data, the third write command data associated with the third write command is saved to the magnetic memory banks 116 at step 416 by following steps 406, 408, 410, 414, and 416 in sequence because the subsequent command (fourth write) is another write command as determined at step 414.

The fourth write command follows the third write command. The fourth write command data associated with the fourth write command may be saved to the memory cache 110 at step 418 by following steps 410, 414 and 418 because the subsequent command (refresh) is not a write command as determined at step 414. At this point, the second and fourth write command data are stored in the memory cache 110 as residual data. Since the subsequent command (refresh) following the fourth write command is a refresh command as determined at step 412, the second and fourth write command data stored in the memory cache 110 is saved to the magnetic memory banks 116 at step 424 by following steps 412, 420, 422, and 424. Depending on circuit implementation, refresh cycle time and frequency, and write time for the magnetic memory banks 116, not all residual data in the memory cache 110 may be saved to the magnetic memory banks 116 during one refresh command. Partial residual data not yet saved to the magnetic memory banks 116 may stay in the memory cache 110 until subsequent refresh commands.

It should be noted that the memory device 100 can be readily modified to accommodate other types of non-volatile memories besides MRAM, such as but not limited to resistive random access memory (ReRAM), phase change random access memory (PCRAM), and conductive bridging random access memory (CBRAM). Accordingly, the memory element 206 of FIG. 2 may comprise a phase change chalcogenide compound, such as but not limited to $Ge_2Sb_2Te_5$ or AgInSbTe, which can switch between a resistive amorphous phase and a conductive crystalline phase. Alternatively, the memory element 206 may comprise a nominally insulating metal oxide material, such as but not limited to NiO, $TiO_2$, or $Sr(Zr)TiO_3$, which can switch to a lower electrical resistance state as the metal rich precipitates grow and link to form conductive paths upon application of an appropriate voltage.

The previously described embodiments of the present invention have many advantages. It is important to note, however, that the invention does not require that all the advantageous features and all the advantages need to be incorporated into every embodiment of the present invention.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. §112, ¶6. In particular, the use of "step of" in the claims herein is not intended to invoke the provisions of 35 U.S.C. §112, §6.

What is claimed is:

1. A memory device for emulating dynamic random access memory (DRAM) comprising:
   one or more magnetic memory banks configured to store data;
   a controller configured to issue a dormant write command and a normal write command, the controller issuing the dormant write command upon receiving a refresh command for recharging DRAM capacitors; and
   a memory cache for storing temporary data and configured to save the temporary data to the one or more magnetic memory banks upon receiving the dormant write command from the controller,
   wherein one of modes of write operation in response to the normal write command bypasses the memory cache and saves data to the one or more magnetic memory banks.

2. The memory device of claim 1 further comprising a memory buffer configured to output the temporary data to the memory cache.

3. The memory device of claim 1, wherein the temporary data is saved to the one or more magnetic memory banks via a data buffer that connects to the memory cache and the one or more magnetic memory banks.

4. The memory device of claim 1, wherein the memory device is compliant with at least one version of low power DDR (LPDDR) Specification or at least one version of DDR SDRAM Specification.

5. The memory device of claim 1, wherein the memory cache operates in a first-in, first-out (FIFO) queuing mode.

6. The memory device of claim 1, wherein each of the one or more magnetic memory banks includes one or more arrays of magnetic memory cells, each magnetic memory cell includes a perpendicular magnetic tunnel junction (MTJ).

7. A dual in-line memory module (DIMM) comprising:
   a module controller including a double data rate (DDR) interface; and
   a plurality of memory devices connected to the module controller, each of the memory devices including:
      one or more magnetic memory banks configured to store data;
      a controller configured to issue a dormant write command and a normal write command, the controller issuing the dormant write command upon receiving a refresh command for recharging DRAM capacitors; and
      a memory cache for storing temporary data and configured to save the temporary data to the one or more magnetic memory banks upon receiving the dormant write command from the controller,
      wherein one of modes of write operation in response to the normal write command bypasses the memory cache and saves data to the one or more magnetic memory banks.

8. The memory device of claim 7, wherein the memory device is compliant with at least one version of low power DDR (LPDDR) Specification or at least one version of DDR SDRAM Specification.

9. The memory device of claim 7, wherein the memory cache operates in a first-in, first-out (FIFO) queuing mode.

10. The memory device of claim 7, wherein each of the one or more magnetic memory banks includes one or more arrays of magnetic memory cells, each magnetic memory cell includes a perpendicular magnetic tunnel junction (MTJ).

11. A method for operating a memory device that includes a data buffer, one or more magnetic memory banks connected to the data buffer, a memory buffer, a memory cache connected to the memory buffer, the method comprising the steps of:
    loading data associated with a write command into the data buffer and the memory buffer;
    determining whether an incoming command immediately following the write command is another write command;
    if the incoming command is another write command, saving the data to the one or more magnetic memory banks from the data buffer; and
    if the incoming command is not another write command, loading the data to the memory cache from the memory buffer and then saving the data to the one or more magnetic memory banks from the memory buffer when the memory device receives a refresh command for recharging DRAM capacitors.

12. The method of claim 11, wherein the memory device is compliant with at least one version of low power DDR (LPDDR) Specification or at least one version of DDR SDRAM Specification.

13. The method of claim 11, wherein the memory cache operates in a first-in, first-out (FIFO) queuing mode.

14. The method of claim 11, wherein each of the one or more magnetic memory banks includes one or more arrays of magnetic memory cells, each magnetic memory cell includes a perpendicular magnetic tunnel junction (MTJ).

* * * * *

UNITED STATES PATENT AND TRADEMARK OFFICE
CERTIFICATE OF CORRECTION

PATENT NO. : 9,921,782 B2
APPLICATION NO. : 15/011344
DATED : March 20, 2018
INVENTOR(S) : Dean K. Nobunaga

Page 1 of 1

It is certified that error appears in the above-identified patent and that said Letters Patent is hereby corrected as shown below:

On the Title Page

Item (74), the name of the agent should be --Bing K. Yen--.

Signed and Sealed this
Sixteenth Day of October, 2018

Andrei Iancu
*Director of the United States Patent and Trademark Office*